United States Patent [19]

Koo

[11] Patent Number: 4,833,676
[45] Date of Patent: May 23, 1989

[54] INTERLEAVED METHOD AND CIRCUITRY FOR TESTING FOR STUCK OPEN FAULTS

[75] Inventor: Frances D. Koo, Los Angeles, Calif.

[73] Assignee: Hughes Aircraft Company, Los Angeles, Calif.

[21] Appl. No.: 79,372

[22] Filed: Jul. 30, 1987

[51] Int. Cl.⁴ ............................................ G01R 31/28
[52] U.S. Cl. ........................................ 371/15; 371/25
[58] Field of Search ................ 371/15, 25; 324/73 R, 324/73 AT

[56] References Cited

U.S. PATENT DOCUMENTS

| | | | |
|---|---|---|---|
| 4,503,386 | 3/1985 | DasGupta et al. | 324/73 R |
| 4,519,078 | 5/1985 | Komonytsky | 371/25 |
| 4,553,236 | 11/1985 | Zasio et al. | 371/25 |
| 4,621,363 | 11/1986 | Blum | 371/25 |
| 4,697,279 | 9/1987 | Baratti et al. | 377/73 |
| 4,698,588 | 10/1987 | Hwang et al. | 324/73 R |

OTHER PUBLICATIONS

Craig et al., "Pseudo-Exhaustive Adjacency Testing: a Bist Approach for Stuck-Open Faults", 1985 International Test Conference, pp. 126-137, 1985.
Eichelberger et al., "A Logic Design Structure for LSI Testability", Proc. 14th Design Automation Conference, New Orleans, Jun. 20-22, 1977.

Primary Examiner—2
Assistant Examiner—Charles E. Atkinson
Attorney, Agent, or Firm—W. J. Streeter; A. W. Karambelas

[57] ABSTRACT

A method and apparatus are disclosed for testing for stuck open faults in integrated circuits (10) having a plurality of combinational logic devices (18, 20). The apparatus includes a chain or shift register stages (22), with each stage including at lest two latches (L1 and L2). Provision (43) is made for interleaving the bits of an initialization test pattern (40) with the bits of a detection test pattern (42) prior to loading the resultant serial data stream into the shift register stages (22). Once loaded, the latches (L2) contain the initialization test pattern whereas the latches (L1) hold the detection test pattern. A multiplexer (52) is provided for selecting one of the outputs from the two latches (L1, L2) so that the initialization test pattern and then the detection test pattern can be quickly applied to the combinational logic so as to minimize hazards which could invalidate the test results.

14 Claims, 2 Drawing Sheets

INTERLEAVED METHOD AND CIRCUITRY FOR TESTING FOR STUCK OPEN FAULTS

CROSS REFERENCE TO RELATED APPLICATIONS

The subject matter of this application is related to U.S. Pat. No. 4,742,293, issued May 3, 1988, entitled "Pseudo-Memory Circuit for Testing for Stuck Open Faults" by Koo et al. and assigned to the same assignee as this invention.

BACKGROUND OF THE INVENTION

1. Technical Field

This invention relates to techniques for testing integrated circuit devices and, more particularly, to methods and apparatus for testing for stuck-open faults in logic devices such as CMOS gates.

2. Discussion

The substantial advances in integrated circuit technology have resulted in large scale integration (LSI) and very large scale integration (VLSI) circuit structures wherein literally hundreds of logic devices are placed on a single silicon chip. However, such high levels of integration present substantial problems in debugging and testing of these integrated circuits. Due to the nature of the highly integrated circuitry, internal nodes cannot be directly accessed and therefore specific internal circuitry cannot be directly tested. Such circuits therefore can generally only be tested by transmitting and receiving signals through external input/output (I/O) terminals of the circuit.

In an attempt to overcome this problem, the use of set/scan registers has been suggested wherein the internal storage elements (e.g., latches) in the integrated circuit are configured so that they can be selectively controlled to operate as shift registers for test purposes. For testing, some of the shift register stages are configured to provide inputs to the combinational logic network to be tested while other shift register stages are configured to accept and store outputs from the combinational logic network in response to the applied test patterns. These outputs are later shifted through the shift register chain to external apparatus for analyzing the test results. The following documents generally relate to the development of set/scan registers and are hereby incorporated by reference: (1) Eichelberger et al, "A Logic Design Structure for LSI Testability", Proc. 14th Design Automation Conference, New Orleans, June 20-22, (1977) pp. 462–468; (2) U.S. patent application Ser. No. 694,931 entitled "Test/Master/Slave Triple Latch Flip-Flop" by Baratti et al, filed 11/4/85, now U.S. Pat. No. 4,697,279 issued Sept. 29, 1987 which is assigned to the assignee of the present invention; and (3) Craig et al, "Pseudo-Exhaustive Adjacency Testing: a BIST Approach for Stuck-Open Faults", International Test Conference, November (1985).

CMOS is rapidly becoming a dominant logic technology for VLSI circuits. One of the testing challenges for CMOS circuit implementation is the detection of stuck-open faults which have been shown to cause combinational circuits to exhibit sequential behavior. The most common approach for testing for stuck-open faults employs a two-pattern test. The first pattern is generally referred to as an initialization test pattern and it is used to drive the output of the devices or gates under test to a given logic state. The second test pattern is generally referred to as a detection test pattern and it is used to activate one path to VDD or ground through the devices under test. If the device under test is stuck open, the device will exhibit a memory property and the output of the device will remain at the value stored during the initialization test pattern. On the other hand, if the device is operating properly it will change state.

It has recently been shown that the two-pattern test must be chosen carefully so that the tests are not invalidated by time-skews in input variable changes or unequal path delays. The invalidation generally occurs when certain function hazards in the faulty circuit or static hazards are excited during the transition from the initialization test pattern to the detection test pattern. Such hazards tend to momentarily close a spurious path to ground in parallel with the device under test and potentially cause the appearance of correct behavior when the device actually has a stuck-open fault. Invalidation of the test results can also potentially occur if a path is closed to a large isolated capacitance, appropriately charged or discharged, within a complex gate. In gates with drive transmission gates, it is also possible for a charge node to extend outside of the gate under test.

SUMMARY OF THE INVENTION

The present invention provides improved set/scan circuitry and methodology which provide a robust test of combinational logic networks utilizing a two-pattern test technique utilizing an initialization test pattern followed by a second detection test pattern.

In the preferred embodiment, each shift register stage is provided with two latches, a first latch for storing a bit of the initialization test pattern, and a second latch for storing a bit of the detection test pattern. Means are provided for loading the multi-bit initialization test pattern and detection test pattern into the shift register chain. According to the present invention means are provided for interleaving the bits of the initialization test pattern and detection test pattern so that bits of each pattern are alternately presented in a serial data stream which is loaded into the shift register chain. In such manner, all of the bits of the initialization test can be stored in the first latches in the stages whereas the detection test pattern can be stored in the second latches. As a result, the shift register chain has the entire initialization test pattern and detection test pattern stored in the two latches. By appropriately controlling multiplexers coupled to these latches, it is possible to rapidly apply the initialization test pattern and then the detection test pattern to the combinational logic thereby minimizing hazards which could invalidate the test results.

BRIEF DESCRIPTION OF THE DRAWINGS

The various advantages of the present invention will become apparent to those skilled in the art by reference to the following specification and the drawings in which.

DESCRIPTION OF THE PREFERRED EMBODIMENT

Figure 1:
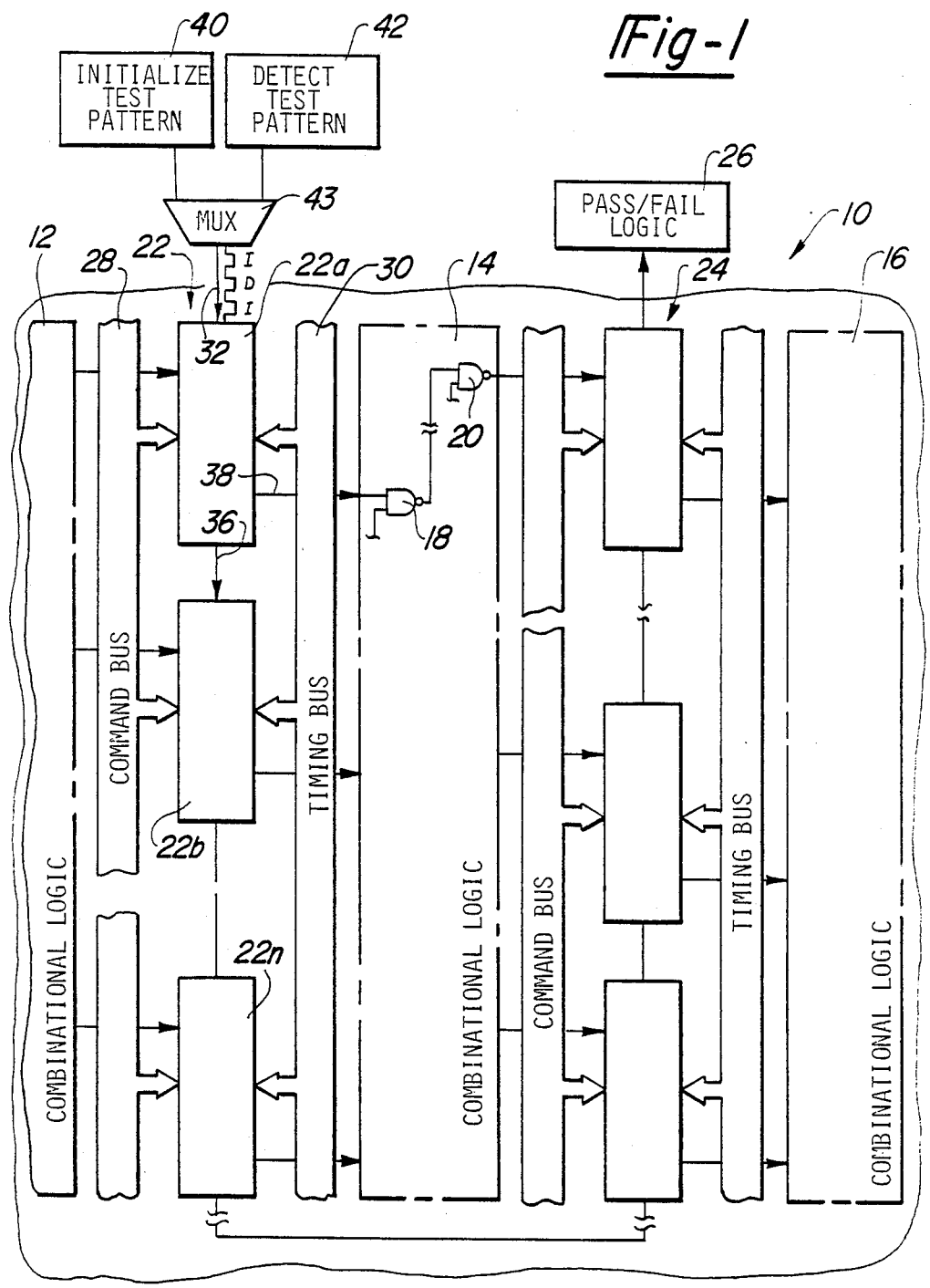
FIG. 1 is a block diagram of circuitry for carrying out the teachings of the present invention.

FIG. 1 schematically illustrates the organization of an integrated circuit chip 10 having blocks 12, 14 and 16 each containing a plurality of combinational logic devices. In FIG. 1, two such devices are shown in block 14 as CMOS NAND gates 18 and 20. However, it should be understood that the integrated circuit device 10 normally will contain hundreds or thousands of such gates in practice, including other logic gates as well as NAND gates. Each of the combinational logic blocks are flanked by a chain of shift register stages. One chain of shift register stages is used to apply test patterns to the combinational logic, while the other chain is used to receive the outputs of the test. For ease in understanding the present invention, it will be described in connection with shift register 22 which is used to apply the test patterns to combinational logic box 14 and shift register 24 which accepts the results of the test. The results are later shifted through the register 24 and observed by suitable pass/fail logic 26 which evaluates the test results.

Each of the shift registers 22, 24 are essentially the same. They include a plurality of interconnected stages and associated command and timing busses. For example, shift register 22 includes stages 22(a) to 22(n), command bus 28 and timing bus 30. The inputs to each stage include a line 32 labeled SCAN-IN and a line 34 labeled CIRCUIT-IN. The outputs for each stage include a line 36 labeled SCAN-OUT and a line 38 labeled CIRCUIT-OUT. The input line 32 for stage 22(a) is connected to external devices that store, interleave and load the initialization test pattern and the detection test pattern into the shift register chain 22. In FIG. 1, these devices respectively bear the numerals 40 and 42 for storing the initialization and detection test patterns, respectively, and a multiplexer 43 (or other functionally equivalent preprocessor device) which serves to interleave the bits of the test patterns from storage devices 40 and 42 so that the serial data stream presented on line 32 consists of bits alternately associated with the initialization test pattern (I) and detection test pattern (D). The present invention is not overly concerned with the specifics of the test patterns. Suffice it to say that each of the test patterns comprises a multi-bit arrangement of data designed to apply a given logic state to a particular combinational logic device.

Figure 2:
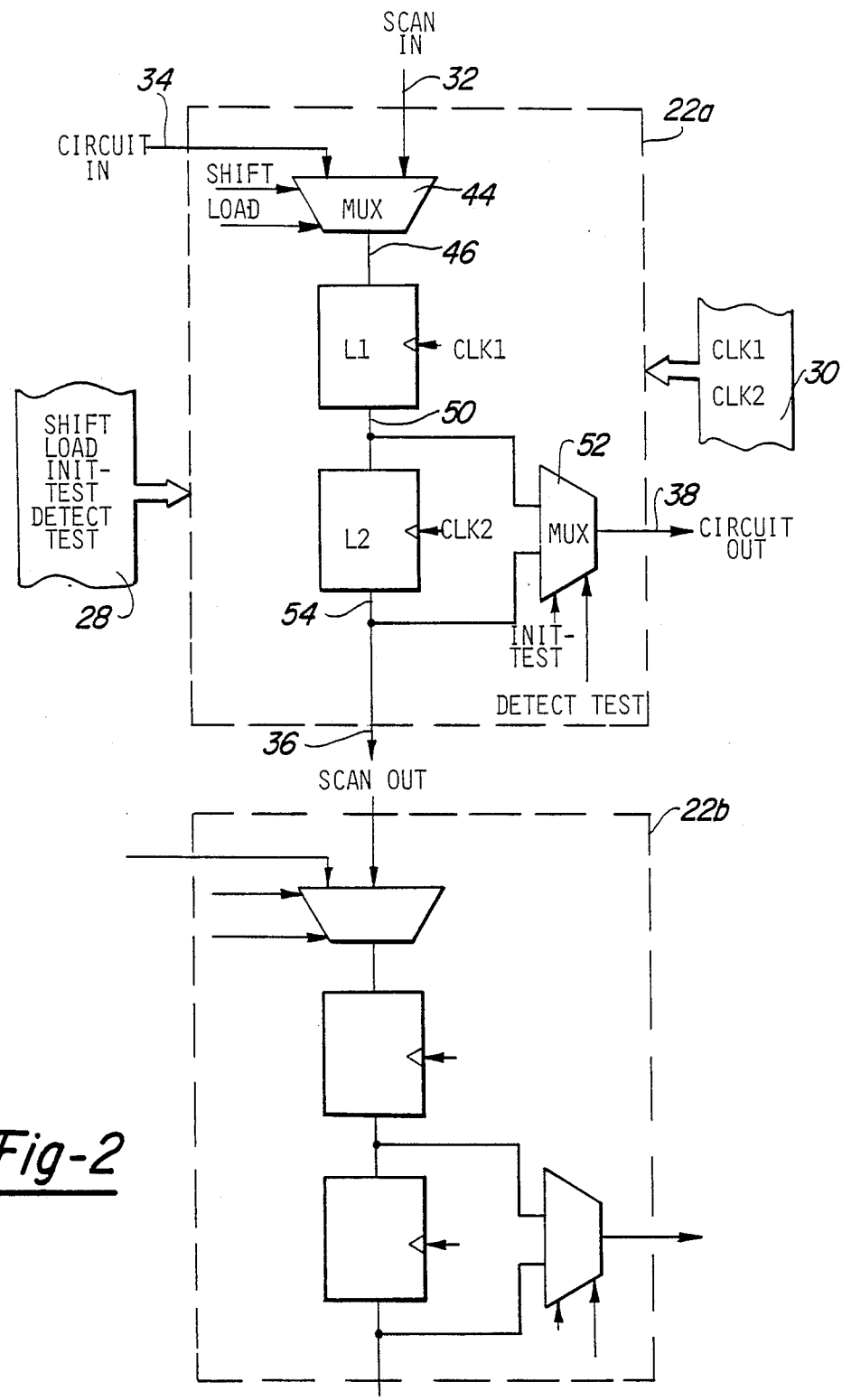
FIG. 2 is a schematic diagram particularly illustrating the circuitry of two shift register stages in accordance with the teachings of the present invention.

FIG. 2 illustrates in more detail the circuitry for each shift register stage. As noted before, each stage is essentially the same and therefore a description of the circuitry for stage 22(a) will be sufficient. The input lines 32 and 34 are fed into the inputs of a multiplexer 44 having an output coupled to an input of a latch L1. The multiplexers and latches used in the present invention are known per se. As is well know, a multiplexer such as multiplexer 44 operates to selectively connect its input(s) to its output(s) depending upon the state of control signals or commands applied to its select inputs. In this embodiment, the commands are provided over command bus 28 and are labeled LOAD and SHIFT. The presence of the LOAD signal will cause the contents on input line 34 to be coupled to the multiplexer output 46 and then loaded or stored into latch L1 during the next occurring clock pulse labeled CLK1 from timing bus 30. On the other hand, an appropriate control signal on the SHIFT select input to multiplexer 44 will cause it to couple the SCAN-IN line 32 to its output 46. This data can be shifted through latch L1 to another latch L2.

The output of latch L2 is coupled to the SCAN-OUT output line 36 for stage 22(a) which is connected to the SCAN-IN input line 32 of the next shift register stage 22(b) in the chain. The output 50 from latch L1 serves as one of two inputs to multiplexer 52. The other input of multiplexer 52 is from the output 54 from latch L2. The output of multiplexer 52 serves as the output line 38 labeled CIRCUIT-OUT.

As discussed above, multiplexer 43 or equivalent preprocessor is used to insure that each bit of the initialization test pattern (I) is followed by a bit from the associated detection test pattern (D). To load this "interleaved" data into the shift register chain 22, command bus 28 applies the SHIFT signals to the inputs of multiplexers 44 in stages 22(a) to 22(n). Then, the bus 30 applies appropriately timed clock signals CLK1 and CLK2 to latches L1 and L2, respectively, to feed the interleaved test patterns down all of the stages until both patterns are entirely loaded into the chain. Since the test patterns have been interleaved, a bit of the initialization test pattern is thus stored in latch L2 whereas a bit of the detection test pattern is stored in latch L1 in each stage. Thus, the entire initialization test pattern is stored in all of the latches L2 in stages 22(a) to 22(n) and, analogously, the entirety of the detection test pattern is stored in latches L1 of the stages making up the shift register chain 22.

To apply the initialization test pattern, the command INIT-TEST is applied over bus 28 simultaneously to multiplexers 52 of all of the shift register stages 22(a) to 22(n). This causes the multi-bit test pattern in latches L2 to be simultaneously applied to all of the selected logic devices 18 in the combinational logic block 14. Quickly thereafter, the detection test pattern can be applied by generating the DETECT-TEST command over bus 28 so that multiplexers 52 now couple the output of latches L1 (containing the detection test pattern bits) to the CIRCUIT-OUT line 38 connected to the combinational logic. Since the initialization test pattern and detection test pattern can be applied in quick succession, the chances for the occurrence of hazards which could invalidate the test results are minimized. After application of the detection test pattern, the output of the combinational logic gates are read by the shift register stages in shift register 24. The stored data is later shifted out of the shift register 24 into the pass/fail logic 26 where the test results can be analyzed.

Those skilled in the art will appreciate that the present invention provides some significant improvements to the state of the art in connection with testing for stuck-open faults. It should be understood that while this invention was described in connection with a particular example thereof, no limitation is intended thereby since the skilled practitioner will realize that other modifications can be made without departing from the spirit of this invention after studying the specification, drawings and following claims.

What is claimed is:

1. A method of testing for stuck-open faults in integrated circuits having a plurality of combinational logic devices, said method comprising:
    interleaving bits of an initialization test pattern and a detection test pattern into a serial data stream so that bits thereof are alternately associated with said patterns;

shifting the data stream down a plurality of shift register stages until the bits of the initialization test pattern are stored in first latches in each stage and bits of the detection test pattern are stored in second latches in each stage; and multiplexing the first and second latches to apply the initialization test pattern and detection test pattern to the combinational logic in quick succession.

2. The method of claim 1 wherein said combinational logic comprises CMOS gates.

3. The method of claim 2 wherein the CMOS gates includes at least one logical NAND gate.

4. The method of claim 3 which further comprises the step of:

reading outputs from the combinational logic in response to the applied test patterns.

5. The method of claim 1 which further comprises:

reading the logical state of the combinational logic after the test patterns have been applied and storing the read data in a plurality of shift register stages; and thereafter, shifting the stored data out of the shift register stages for analyzing the test results.

6. Apparatus for testing for stuck-open faults in integrated circuits having a plurality of combinational logic devices, said apparatus comprising:

a chain of shift register stages, each stage being substantially identical and including first and second latch means;

a source of a multi-bit initialization test pattern;

a source of a multi-bit detection test pattern;

means for interleaving bits of said multi-bit initialization test pattern with bits of said multi-bit detection test pattern to provide a serial data stream whose bits are alternately associated with said patterns;

means for loading said data stream into the chain and storing bits of the initialization test pattern in the first latches of the stages and storing bits of the detection test pattern in the second latches of the stages;

each stage further including multiplexer means having inputs coupled to outputs of said first and second latches, with an output coupled to a given combinational logic device; said multiplexer means being adapted to connect its output to said first or second latch in response to given commands;

command means for generating a command sufficient to cause all of said multiplexer means in each of the stages to couple their outputs to the first latch whereby said initialization test pattern is simultaneously applied in parallel to a plurality of said combinational logic devices; and said command means being further operative to thereafter cause said multiplexer means in each of the stages to simultaneously connect their outputs to said second latch means to thereby apply said detection test pattern to said combinational logic devices whereby said initialization and detection test patterns can be quickly applied so as to minimize hazards which could invalidate test results.

7. The apparatus of claim 6 wherein each stage further comprises:

a plurality of data inputs including a first input for receiving said serial data stream containing the interleaved test patterns and a second input for receiving data to be read from other combinational logic.

8. The apparatus of claim 7 wherein each stage includes:

a plurality of data outputs, a first output being connected to the combinational logic for applying the test patterns thereto and a second output which is used to transfer data from one stage to the input of another stage.

9. In an integrated circuit having several blocks of CMOS gates, a chain of shift register stages interposed between each block, first storage means for storing a multi-bit initialization test pattern, and a second storage means for storing a multi-bit detection test pattern, the improvement wherein each shift register stage is substantially identical and comprises:

a first data input which can be used to receive said test patterns;

a second data input connected to an output of a given CMOS gate in one block;

a first data output connected to an input of a given CMOS gate in another block;

a second output which can be used to couple the test patterns to other stages in the chain;

first multiplexer means having inputs coupled for receipt of said first and second data inputs of the stage;

first latch means having an input coupled to an output of the first multiplexer means;

second latch means coupled to the output of the first latch;

second multiplexer means having an output coupled to the first output for the stage, said second multiplexer means having inputs thereof coupled to outputs of said first latch and said second latch; and command means for controlling the operation of said first and second multiplexers.

10. The improvement of claim 9 wherein said command means is operative to shift a serial stream of data having alternate bits thereof associated with an initialization and detector test patterns through the stage and storing adjacent bits thereof in said first and second latches.

11. The improvement of claim 10 wherein said command means is adapted to control said second multiplexer means so as to first connect the output of the second latch means to the output of the second multiplexer whereby the initialization test pattern is simultaneously applied in parallel to CMOS gates of said another given block; and wherein said command means is further operative to thereafter control said second multiplexer means to connect the output of the first latch means to its output whereby to apply said detection test pattern to the gates in said another block.

12. The improvement of claim 10 wherein an output from a shift register stage is coupled to means for analyzing the test results.

13. The improvement of claim 12 wherein said command means is operative to cause the stage to read data from a given gate in said one block, and thereafter, to shift said data to the means for analyzing the test results.

14. The improvement of claim 13 wherein the first data input is coupled to means for interleaving the test patterns contained in the first and second storage means to thereby generate said serial data stream.

* * * * *